United States Patent
Yen et al.

(10) Patent No.: US 9,196,798 B2
(45) Date of Patent: Nov. 24, 2015

(54) SEMICONDUCTOR LIGHT-EMITTING DEVICE AND FABRICATING METHOD THEREOF

(71) Applicant: HIGH POWER OPTO. INC., Taichung (TW)

(72) Inventors: Wei-Yu Yen, Taichung (TW); Li-Ping Chou, Taichung (TW); Fu-Bang Chen, Taichung (TW); Chih-Sung Chang, Taichung (TW)

(73) Assignee: HIGH POWER OPTO. INC., Taichung (TW)

( * ) Notice: Subject to any disclaimer, the term of this patent is extended or adjusted under 35 U.S.C. 154(b) by 0 days.

(21) Appl. No.: 14/473,185

(22) Filed: Aug. 29, 2014

(65) Prior Publication Data

US 2014/0367726 A1    Dec. 18, 2014

Related U.S. Application Data

(63) Continuation-in-part of application No. 13/735,322, filed on Jan. 7, 2013, now Pat. No. 8,896,007.

(30) Foreign Application Priority Data

Sep. 12, 2012 (TW) .............................. 101133344 A

(51) Int. Cl.
| | | |
|---|---|---|
| *H01L 33/60* | (2010.01) | |
| *H01L 33/40* | (2010.01) | |
| *H01L 33/14* | (2010.01) | |
| H01L 33/22 | (2010.01) | |
| H01L 33/44 | (2010.01) | |

(52) U.S. Cl.
CPC .............. *H01L 33/405* (2013.01); *H01L 33/14* (2013.01); *H01L 33/22* (2013.01); *H01L 33/44* (2013.01)

(58) Field of Classification Search
CPC .................................. H01L 33/60; H01L 33/38
USPC .......................... 257/98, E33.06, 100, 686, 88
See application file for complete search history.

(56) References Cited

U.S. PATENT DOCUMENTS

| | | | |
|---|---|---|---|
| 6,242,761 B1 | 6/2001 | Fujimoto et al. | |
| 7,795,623 B2 | 9/2010 | Emerson et al. | |
| 8,017,963 B2 | 9/2011 | Donofrio et al. | |
| 2011/0215350 A1* | 9/2011 | Song et al. | 257/93 |
| 2012/0119243 A1* | 5/2012 | Kim et al. | 257/98 |
| 2013/0234182 A1 | 9/2013 | Katsuno et al. | |

FOREIGN PATENT DOCUMENTS

| | | |
|---|---|---|
| TW | 201145566 | 12/2011 |
| TW | 201145591 | 12/2011 |

OTHER PUBLICATIONS

Taiwan Intellectual Property Office, "Office Action" Apr. 20, 2015.

* cited by examiner

*Primary Examiner* — Chuong A Luu
*Assistant Examiner* — Rodolfo Fortich
(74) *Attorney, Agent, or Firm* — WPAT, PC; Justin King

(57) ABSTRACT

A semiconductor light-emitting device including an epitaxial structure, a first electrode structure, a second electrode structure, a light reflective metal layer, a resistivity-enhancing structure and a protection ring is provided. The light-emitting epitaxial structure has a first surface and a second surface. The light-emitting epitaxial structure has a first zone and a second zone. The first electrode structure is disposed within the first zone. The second electrode structure is disposed within the second zone. The light reflective metal layer is disposed adjacent to the second surface. The resistivity-enhancing structure is disposed in contact with a surface of the light reflective metal layer and corresponding to a position of the first electrode structure. The protection ring has a first portion and a second portion. The first portion surrounds a sidewall of the light reflective metal layer. The second portion corresponds to the second electrode structure.

13 Claims, 10 Drawing Sheets

SEMICONDUCTOR LIGHT-EMITTING DEVICE AND FABRICATING METHOD THEREOF

CROSS-REFERENCE TO RELATED APPLICATIONS

This application is a continuation-in-part application of U.S. patent application Ser. No. 13/735,322 filed Jan. 7, 2013, now pending. The content of the above-mentioned patent application is hereby incorporated by reference herein in its entirety and made a part of this specification.

BACKGROUND OF THE INVENTION

1. Field of the Invention

The present invention relates to a semiconductor device and the fabricating method thereof, and more particularly, to a semiconductor light-emitting device and the fabricating method thereof.

2. Description of Related Art

Semiconductor light-emitting devices, e.g. light emitting diodes, have been increasingly widespread used in fields of lighting, display panel, indicator lamp, etc. An epitaxial structure of a light emitting diode includes at least two semiconductor layers with opposite conductivity types to form a p-n junction at the boundary of the two semiconductor layers. When a semiconductor light-emitting device is subjected to a voltage, electric current is introduced to passing through the semiconductor layers from one electrode to anther along a shortest route, and charge-carriers—electrons and electron holes—combination occurs within the p-n junction, whereby the electrical energy is converted into light and emitted from the semiconductor light-emitting device.

However, since the converted light typically is emitted from an area of the p-n junction intersected with the shortest route of the electric current, and the shortest route of the electric current typically aligns to these two electrodes which are typically non-transparent, thus large amount of the emitting light would be shielded and absorbed by these electrodes. As a result, light-emitting efficiency of the conventional semiconductor light-emitting devices would be significantly reduced.

In addition, most of the electricity in a semiconductor light-emitting device becomes heat rather than light. If this heat is not removed, the device runs at high temperatures, which not only lower light-emitting efficiency, but also make the device less reliable.

Therefore, there is a need to improve the light-emitting efficiency and reliability of the conventional semiconductor light-emitting devices.

SUMMARY OF THE INVENTION

In accordance with an aspect of the present invention, a semiconductor light-emitting device is provided. The semiconductor light-emitting device includes a light-emitting epitaxial structure, a first electrode structure, a second electrode structure, a light reflective metal layer, a resistivity-enhancing structure and a protection ring. The light-emitting epitaxial structure has a first surface and a second surface opposite to the first surface. The light-emitting epitaxial structure has a first zone and a second zone enclosing the first zone. The first electrode structure disposed within the first zone is electrically connected to the first surface. The second electrode structure disposed within the second zone and in electrically contact with the first surface. The light reflective metal layer is disposed adjacent to the second surface. The resistivity-enhancing structure is disposed in contact with a surface of the light reflective metal layer and corresponding to a position of the first electrode structure, wherein the surface of the light reflective metal layer is away from the second surface. The protection ring has a first portion and a second portion. The first portion surrounds and contacts with a sidewall of the light reflective metal layer. The second portion is corresponding to the second electrode structure and in contact with the surface of the light reflective metal layer.

In one embodiment of the present invention, the light-emitting epitaxial structure comprises a first semiconductor layer with a first conductivity type, a second semiconductor layer with a second conductivity type and a light-emitting layer. The first semiconductor layer has a surface serving as the first surface. The second semiconductor layer has a surface serving as the second surface. The light-emitting layer is disposed between the first semiconductor layer and the second semiconductor layer.

In one embodiment of the present invention, the resistivity-enhancing structure has a central axial aligned with that of the first electrode structure.

In one embodiment of the present invention, the semiconductor light-emitting device further includes a buffer layer, a binding layer, a substrate, and a third electrode structure. The buffer layer is disposed adjacent to the light reflective metal layer and the resistivity-enhancing structure. The binding layer is disposed adjacent to the buffer layer and away from the light reflective metal layer. The substrate is disposed adjacent to the binding layer and away from the buffer layer. The third electrode structure electrically contacts with the substrate.

In one embodiment of the present invention, the protection ring and the resistivity-enhancing structure are disposed between the buffer layer and the surface of the light reflective metal layer.

In one embodiment of the present invention, a part of the first portion of the protection ring contacts with the second surface of the light-emitting epitaxial structure.

In one embodiment of the present invention, the first portion of the protection ring has a width ranging from 5 micrometers to 100 micrometers.

In one embodiment of the present invention, the resistivity-enhancing structure is beneath the first electrode structure and an edge of the resistivity-enhancing structure is aligned with a sidewall of the first electrode structure or exceeds the sidewall of the first electrode by a distance ranging between 0 and 50 micrometers.

In one embodiment of the present invention, the second portion of the protection ring is beneath the second electrode structure and an edge of the second portion of the protection ring is aligned with a sidewall of the second electrode structure or exceeds the sidewall of the second electrode structure by a distance ranging between 0 and 50 micrometers.

In one embodiment of the present invention, the edge of the second portion of the protection ring extends inwards along the surface of the light reflective metal layer.

In one embodiment of the present invention, the second portion of the protection ring has a thickness ranging from 100 angstroms to 10000 angstroms.

In accordance with another aspect of the present invention, a method for fabricating a semiconductor light-emitting device is provided. A light-emitting epitaxial structure with a first surface and a second surface opposite to the first surface is firstly provided. The light-emitting epitaxial structure has a first zone and a second zone enclosing the first zone. A light reflective metal layer is then formed over the second surface.

Next, a resistivity-enhancing structure is formed over the light reflective metal layer. Subsequently, a protection ring having a first portion and a second portion is formed. The first portion surrounds and contacts with a sidewall of the light reflective metal layer and the second portion is disposed on the light reflective metal layer. Then, a first electrode structure electrically connected to the first surface is formed within the first zone and corresponding to a position of the resistivity-enhancing structure. A second electrode structure in electrically contact with the first surface is next formed within the second zone and corresponding to a position of the second portion of the protection ring.

In one embodiment of the present invention, the providing the light-emitting epitaxial structure includes: A light-emitting layer is formed over a first semiconductor layer having a first conductivity type and a surface serving as the first surface, wherein the light-emitting layer is disposed away from the first surface. A second semiconductor layer having a second conductivity type is then formed over the light-emitting layer, wherein the second semiconductor layer has a surface serving as the second surface.

In one embodiment of the present invention, the protection ring and the resistivity-enhancing structure are formed concurrently.

In one embodiment of the present invention, the method further includes: A buffer layer is conformally formed over the resistivity-enhancing structure, the protection ring and a part of the light reflective metal layer. A binding layer is then formed over the buffer layer. Next, a substrate is formed over the binding layer. Subsequently, a third electrode structure is formed over the substrate, wherein the third electrode structure is electrically connected to the substrate.

BRIEF DESCRIPTION OF THE DRAWINGS

The above objects and advantages of the present invention will become more readily apparent to those ordinarily skilled in the art after reviewing the following detailed description and accompanying drawings, in which.

DESCRIPTION OF EMBODIMENTS

The present invention will now be described more specifically with reference to the following embodiments. It is to be noted that the following descriptions of preferred embodiments of this invention are presented herein for purpose of illustration and description only. It is not intended to be exhaustive or to be limited to the precise form disclosed.

Figure 1:
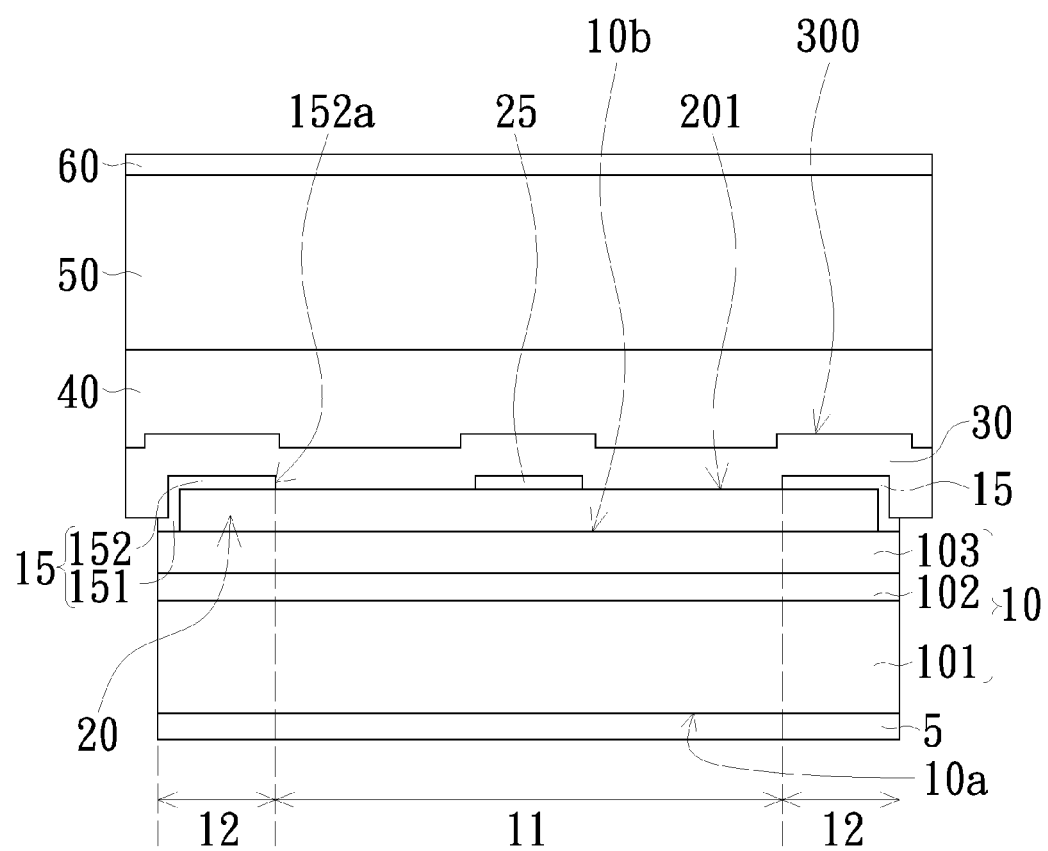
FIG. 1 and FIG. 2 are cross-sectional views schematically illustrating the configuration of a semiconductor light-emitting device in accordance with a one embodiment of the present invention.

With reference to FIG. 1, a cross-sectional view of the configuration of a semiconductor light-emitting device in accordance with one embodiment of the present invention is schematically illustrated. A method for fabricating the semiconductor light-emitting device of the embodiment comprises steps as follows: Firstly, a first substrate 5 is provided and an epitaxial structure 10 is then formed over the first substrate 5. In some embodiments, the step of forming of the epitaxial structure 10 includes forming a first semiconductor layer 101, a light-emitting layer 102, and a second semiconductor layer 103 over the first substrate 5 sequentially, wherein a surface of the first semiconductor layer 101 that is disposed adjacent to the first substrate is referred as a first surface 10a of the epitaxial structure 10, and a surface of the second semiconductor layer 103 that is disposed opposite to the first surface 10a is referred as a second surface 10b of the epitaxial structure 10. Besides, the light emitting layer 102 is disposed away from the first surface 10a and the second surface 10b.

The first semiconductor layer 101 has a conductivity type opposed to that of the second semiconductor layer 103, and the conductivity types of the first semiconductor layer 101 and the second semiconductor layer 103 are interchangeable. For example, the former can be an N-type doped layer and the later can be a P-type doped layer or vice versa. The first semiconductor layer 101 and the second semiconductor layer 103 may be made of (but not limited to) group-III elements nitride, e.g. gallium nitride (GaN), aluminum nitride (AlN), indium nitride (InN), aluminum gallium nitride (AlGaN), or indium gallium nitride (InGaN), etc.

Figure 2:
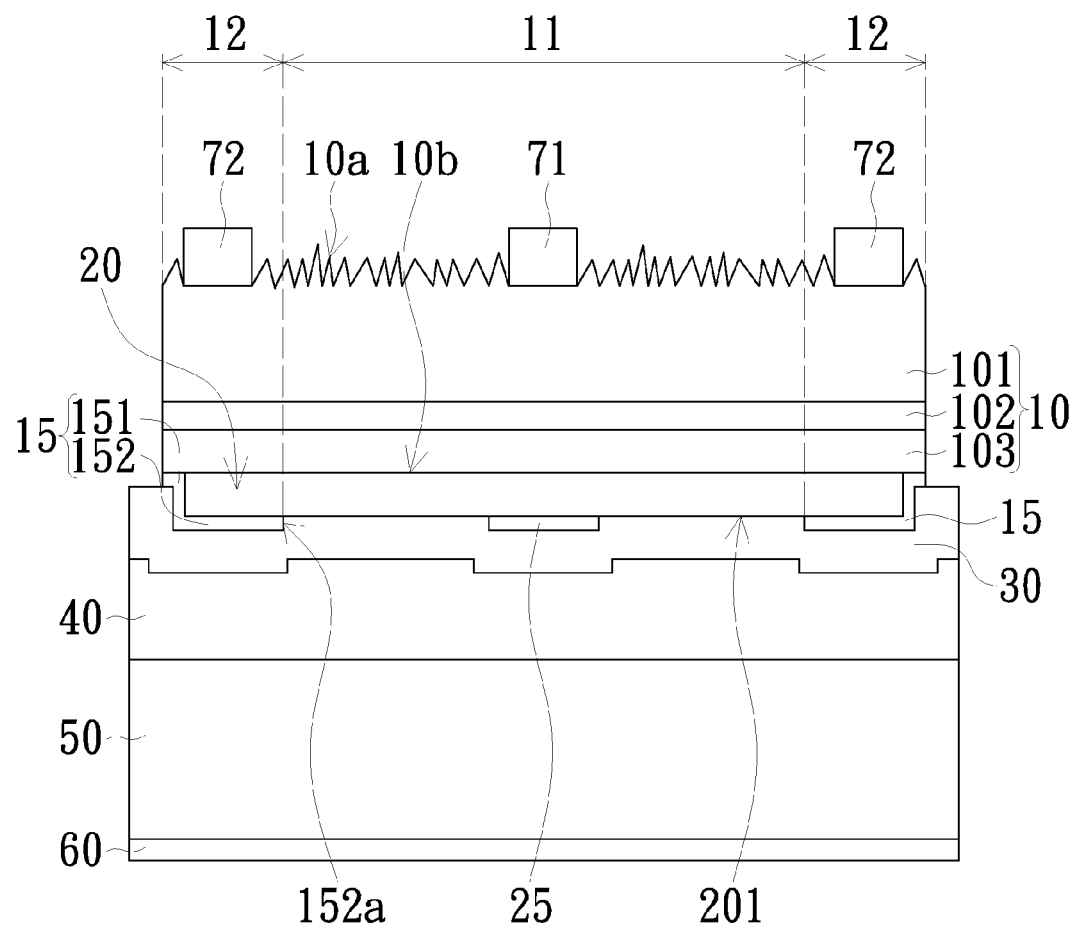

In the embodiment of the present invention, the epitaxial structure 10 may have a first zone 11 and a second zone 12, wherein the first zone 11 is enclosed by the second zone 12. That is, the second zone 12 is the periphery of the epitaxial structure 10, as shown in FIG. 1 and FIG. 2. In addition, the first zone 11 is light-emitting zone of the epitaxial structure 10.

In the embodiment of the present invention, a light reflective metal layer 20 is formed over the second surface 10b of the epitaxial structure 10. The light reflective metal layer 20 may cover the whole first zone 11 and the most second zone and is used to reflect the light generated from the light-emitting layer 102 in order to direct the light emitting outwards from the first surface 10a. The light reflective metal layer 20 may be a metal coating made of silver, nickel, aluminum, silver/titanium tungsten/platinum alloy or the like. For example, in some embodiments, the light reflective metal layer 20 may be made of silver/titanium tungsten/platinum alloy including a silver layer with a thickness ranging from 100 nanometers to 300 nanometers, a titanium tungsten layer with a thickness ranging from 20 nanometers to 300 nanometers and a platinum layer with a thickness substantially less than 500 nanometers. In another embodiment, the light reflective metal layer 20 may consist of silver/titanium/platinum alloy including a silver layer with a thickness ranging from 200 nanometers to 300 nanometers, a titanium layer with a thickness ranging from 20 nanometers to 300 nanometers and a platinum layer with a thickness substantially less than 500 nanometers. In addition, the platinum layer of the former embodiment may be replaced by a nickel layer with the same thickness. In a further embodiment, the light reflective metal layer 20 may be made of silver/nickel alloy coating including a silver layer with a thickness ranging from 200 nanometers to 300 nanometers and a nickel layer with a thickness less than 500 nanometers.

Then, at least one resistivity-enhancing structure 25 is formed over the light reflective metal layer 20 and only formed over the first zone 11, wherein a surface 201 of the light reflective metal layer 20 is away from the second surface 10b of the epitaxial structure 10. In some embodiments, at least one resistivity-enhancing structure 25 physically contacts with the surface 201 of the light reflective metal layer 20. The resistivity-enhancing structure 25 is capable of reducing the conductivity of the regions where the resistivity-enhancing structure 25 is disposed. The resistivity-enhancing structure 25 may be made of an insulation material selected from a group consisting of silicon dioxide (SiO2), titanium dioxide (TiO2), Indium tin oxide (ITO), silicon nitride (SiN), aluminum nitride (AlN), and the arbitrary combinations thereof.

Next, a protection ring 15 is only formed over the second zone 12. The protection ring 15 may have a L-shaped structure (from a cross-section view) consisting of a first portion 151 and a second portion 152. The light reflective metal layer 20 may be enclosed by the first portion 151 of the protection ring 15. In the embodiment of the present invention, the first portion 151 may physically contacts with most or all sidewalls of the light reflective metal layer 20 and/or the partial second surface 10b of the epitaxial structure 10. The second portion 152 may physically contacts with the partial surface 201 of the light reflective metal layer 20 and/or may have an end 152a extending inwards along the surface 201. In some embodiments, the second portion 152 may uncover the first zone 11.

Since molecules of the light reflective metal layer 20 would easily migrate during the semiconductor manufacturing process for fabricating the semiconductor light-emitting device or due to the heat flow when the semiconductor light-emitting device is operated, the protection ring 15 is capable of hindering molecules of the light reflective metal layer 20 from migrating. It is noticeable that the protection ring 15 may also enable the regions where the protection ring 15 is disposed to decrease the heat crowding and the electric current or the conductivity.

The protection ring 15 may be made of an insulating material selected from a group consisting of titanium dioxide, silicon dioxide, indium tin oxide, silicon nitride, materials for forming a distributed bragg reflector and the arbitrary combinations thereof which is stable and hardly to be changed in physical property. The resistivity-enhancing structure 25 and the protection ring 15 may be formed in the same step of the manufacturing process with identical materials. In some embodiments, the materials of the resistivity-enhancing structure 25 and the protection ring 15 may be different. Thus, the resistivity-enhancing structure 25 and the protection ring 15 are formed in separate steps with different materials.

Next, a buffer layer 30 that can also hinder the molecules of the light reflective metal layer 20 from migration is formed on the resistivity-enhancing structure 25, the protection ring 15, and the partial light reflective metal layer 20 conformally. The outside sidewall of the protection ring 15 may be enveloped by the buffer layer 30. The buffer layer 30 that has good conductivity and stability may be a single-layer or multi-layer structure including at least two kinds of metals, such as, titanium, platinum, titanium tungsten, nickel, aluminum, etc. The molecule migration of the light reflective metal layer 20 would be markedly depressed due to the cooperative wrapping of the protection ring 15 and the buffer layer 30 so that the light-reflected efficiency of the light reflective metal layer 20 would be enhanced substantially.

Next, a binding layer 40, a second substrate 50, and a bottom electrode structure 60 (third electrode structure) are sequentially formed over the light reflective metal layer 20, wherein the bottom electrode structure 60 is electrically connected to the second substrate 50. Besides, the binding layer 40, which may be made of gold indium or gold tin, is used to bind the second substrate 50 with the light reflective metal layer 20 (or the buffer layer 30).

In addition, the buffer layer 30 is uneven. It is because that the buffer layer 30 is formed on the protection ring 15 and the resistivity-enhancing structure 25 that are separately disposed on and protrudes from the surface 201 of the light reflective metal layer 20, thus the buffer layer 30 that conforms to the protection ring 15 and the resistivity-enhancing structure 25 and the light reflective metal layer 20 has a plurality of protrusions 300 extending from the surface adjacent to the binding layer 40. Moreover, the buffer layer 30 has a thermal expansion coefficient ranging between that of the epitaxial structure 10 and that of the second substrate 50. Accordingly, by adopting the buffer layer 30 with uneven surface and a certain thermal expansion coefficient the stress generated between the epitaxial structure 10 and the second substrate 50 can be released without additional steps.

Thereafter, the resultant structure as shown in FIG. 1 is flipped upside down and the first substrate 5 is then removed to expose the first surface 10a of the epitaxial structure 10, as shown in FIG. 2. The exposed first surface 10a may be roughened for the purpose of increasing the amount of scattering light emitting outwards from the first surface 10a.

Figure 3A:
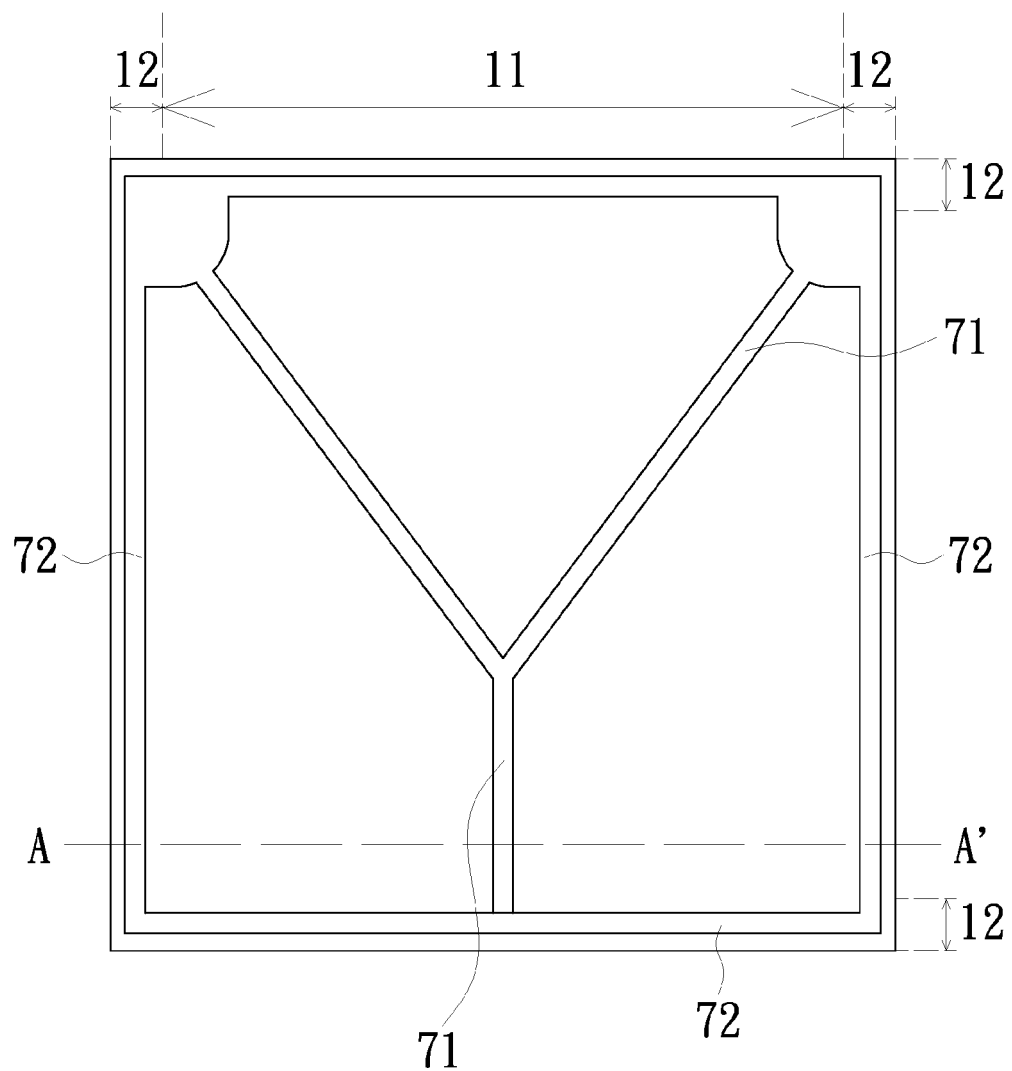
FIG. 3A to FIG. 3D are schematic top views illustrating the configuration of a semiconductor light-emitting device in accordance with four embodiments of the present invention.
Figure 3B:
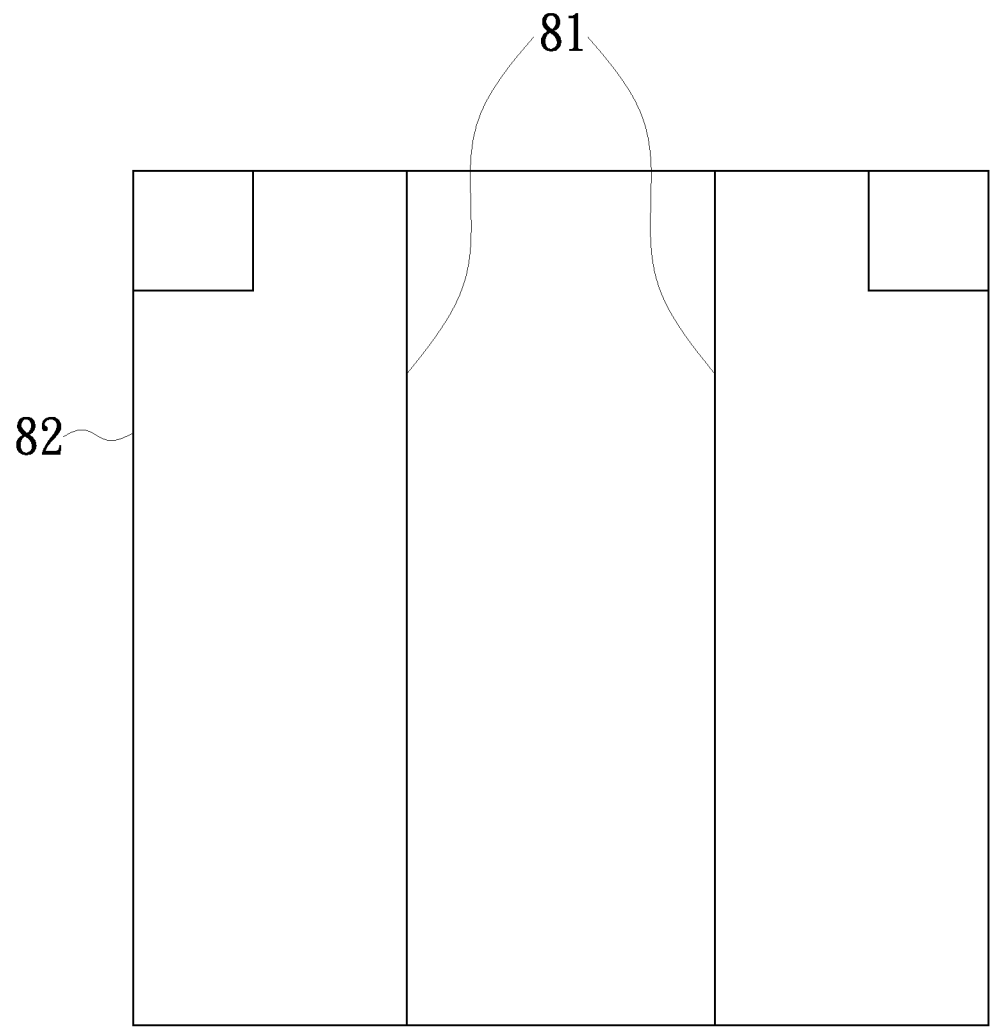
Figure 3C:
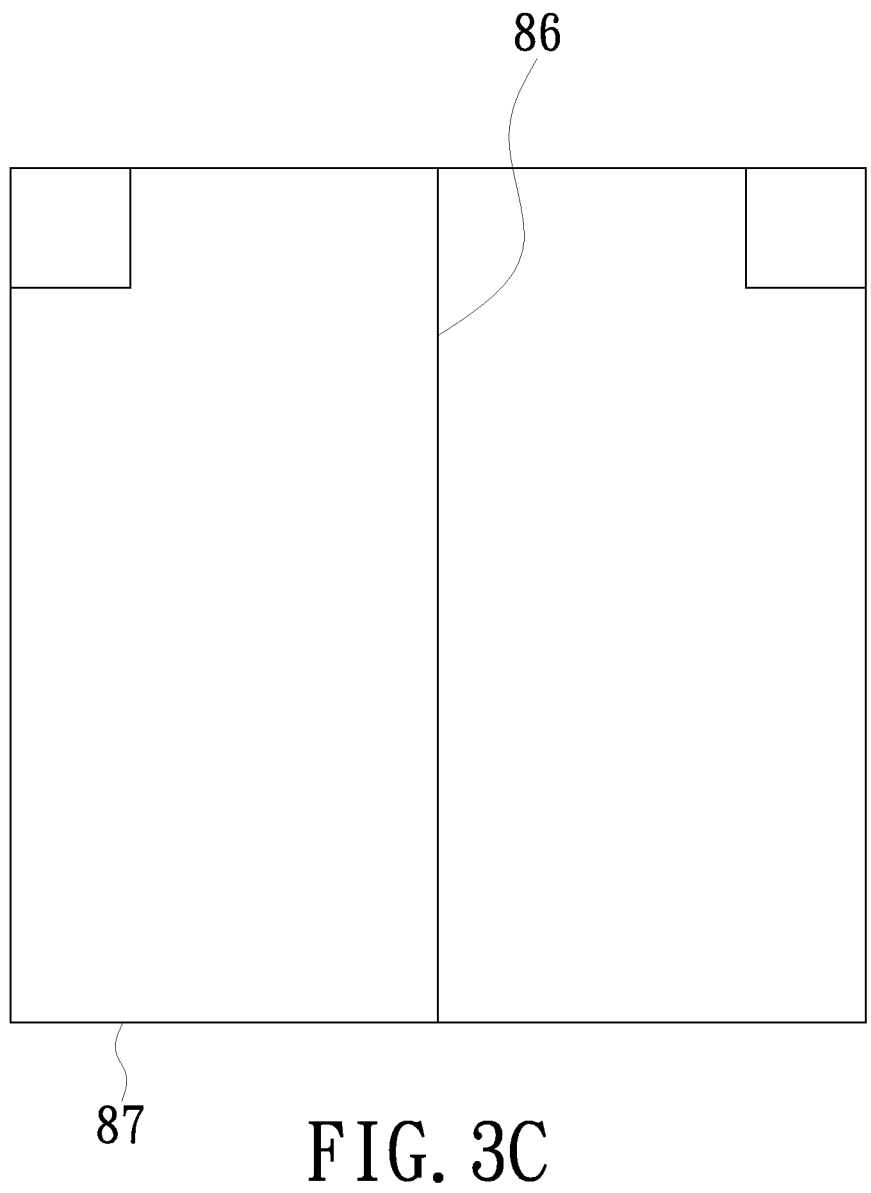
Figure 3D:
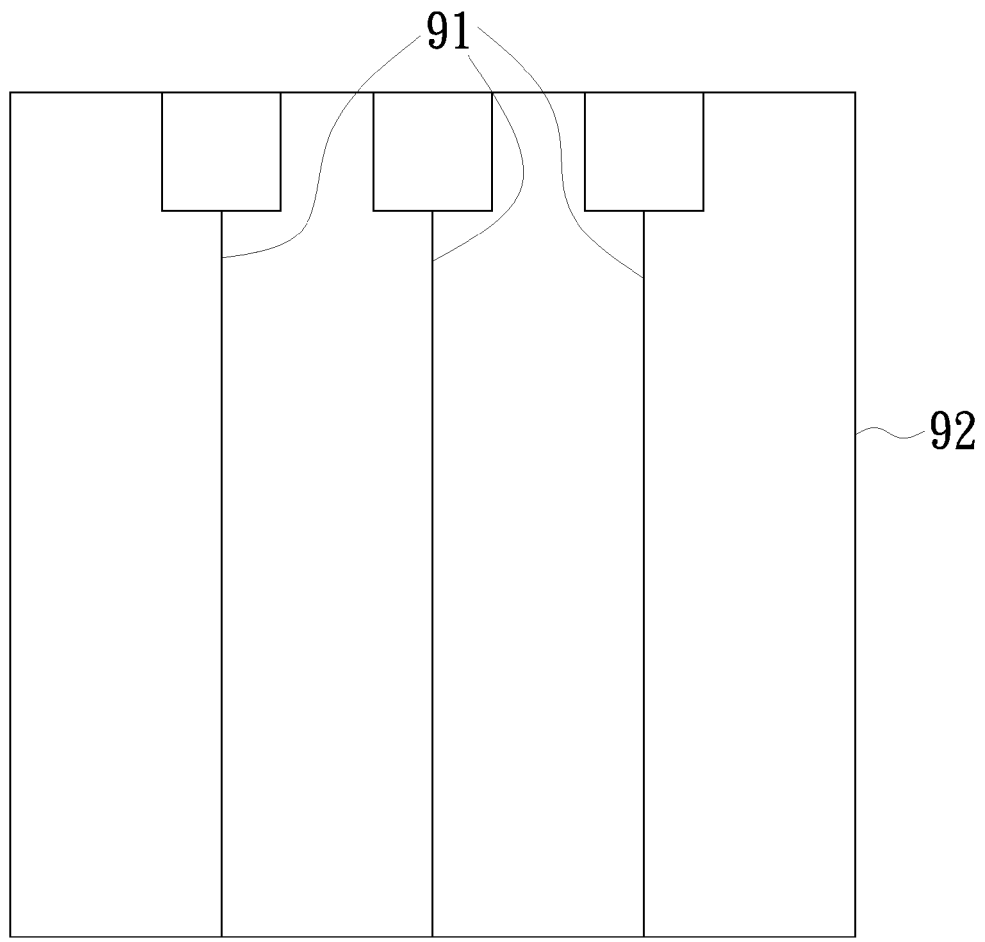

Then, a first electrode structure 71 and a second electrode structure 72 are disposed over the first surface 10a and electrically contact with the first surface 10a. With reference to FIG. 3A to FIG. 3D, schematic top views of the configuration of semiconductor light-emitting devices in accordance with four embodiments of the present invention are illustrated. Various layouts of first electrode structures and the second electrode structures are shown in FIG. 3A to FIG. 3D. The first electrode structure 71 is in a Y shape, as shown in FIG. 3A. In FIG. 3B, the first electrode structure 81 having two strips which connect with the second electrode structure 82. In FIG. 3C, there is only one strip of the first electrode structure 86 connecting with the second electrode structure 87. The first electrode structure 91 has three strips connecting with the second electrode structure 92, as shown in FIG. 3D. Moreover, the second electrode structures 72, 82, 87, 92 are all disposed at the periphery and surround the first electrodes structures.

In addition, FIG. 2 is the cross-sectional view taken along line A-A' of FIG. 3A. It is to be noted that the first electrode structure 71 is only placed over the first zone 11 and the resistivity-enhancing structure 25 is disposed beneath the first electrode structure 71 so as to from a Y shape form the top view; and the second electrode structure 72 is only placed over the second zone 12 and the protection ring 15 is disposed beneath the second electrode structure 72 so as to form a ring or rectangle structure. It is noticeable that regardless of the variation of the layout of electrode structures, the positions of the resistivity-enhancing structure and the protection ring are respectively corresponding to the first and second electrode structures.

Figure 4A:
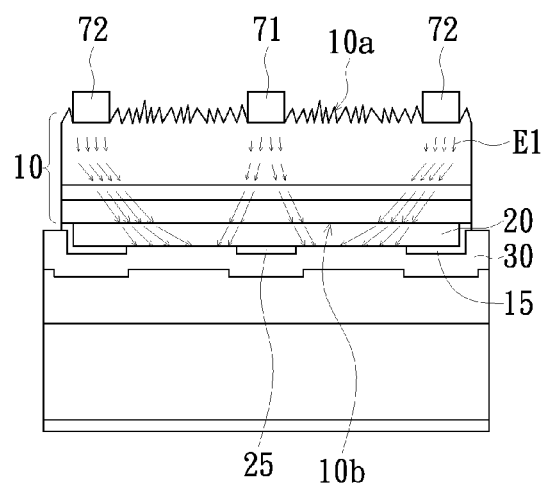
FIG. 4A is a cross-sectional view schematically illustrating the electric current in a semiconductor light-emitting device in accordance with one embodiment of the present invention.

With reference to FIG. 4A, the resistivity-enhancing structure 25 and the protection ring 15 are formed between the buffer layer 30 and the light reflective metal layer 20, as described above. Regarding to FIG. 4B, in some embodiments, current blocks 27 formed between the light reflective metal layer 20 and the epitaxial structure 10 may replace the resistivity-enhancing structure 25 and the protection ring 15. However, the second surface 10b of the epitaxial structure 10 may be impaired by forming the current blocks 27. In contrast, the positions of the protection ring 15 and the resistivity-enhancing structure 25 can prevent the second surface 10b of the epitaxial structure 10 from damage so as to reduce the resistivity of the second surface 10b.

Furthermore, since the resistivity-enhancing structure 25 and the protection ring 15 are made of insulation materials that are capable of increasing resistivity of the regions where the resistivity-enhancing structure 25 and the protection ring 15 are disposed, the electric current may be hindered from flowing through these regions. Thus, the electric current that always takes along the shortest route can be kept from flowing through the regions where the resistivity-enhancing structure 25 and the protection ring 15 are disposed. As a result, the electron flow E1 can be dispersed and kept from passing though the regions of the epitaxial structure 10 beneath the first electrode structure 71 and the second electrode structure 72 (see FIG. 4A). It is to say, most of the electron flow E1 may passing around the regions of the epitaxial structure 10 beneath the first electrode structure 71 and the second electrode structure 72, whereby light emitted from these regions may be decreased, and light emission around these regions may be enhanced significantly.

Figure 4B:
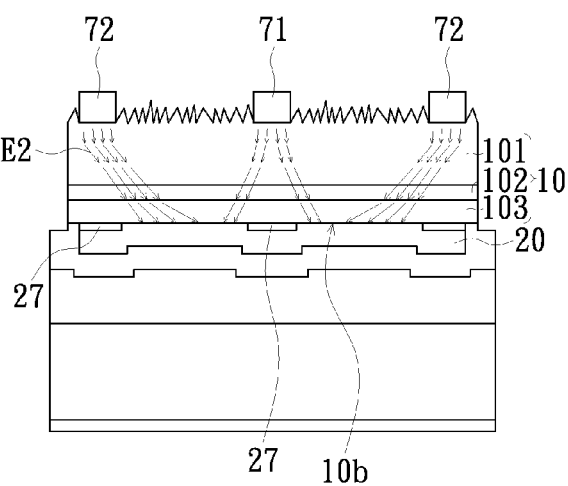
FIG. 4B is a cross-sectional view schematically illustrating the electric current in a semiconductor light-emitting device in accordance with one embodiment of the present invention.

By comparing the device of FIG. 4A with that of FIG. 4B, for example, a distance between the first electrode structure 71 and the resistivity-enhancing structure 25 is greater than a distance between the first electrode structure 71 and the current block 27 so that the electron flow E1 may be distributed more uniformly around these regions in the device of FIG. 4A than the electron flow E2 in that of FIG. 4B; and the operation voltage of the device of FIG. 4A may be smaller than that of FIG. 4B.

Moreover, as shown in FIG. 4B, since the current blocks 27 are disposed between a heterogeneous interface of the second semiconductor layer 103 and the light reflective metal layer 20 (made of metal), charge accumulation effect and current crowding effect may occur at the current blocks 27 while the electron flow E2 flows through the current blocks 27. In contrast, since the protection ring 15 and the resistivity-enhancing structure 25 are disposed between a homogenous interface of the light reflective metal layer 20 (made of metal) and the buffer layer 30 (made of metal), it is advantageous to electron transmission.

As a result, the consumption of power of the device of FIG. 4A less than that of FIG. 4B can be observed. Hence, the protection ring 15 and the resistivity-enhancing structure 25 disposed between the light reflective metal layer 20 and the buffer layer 30, as shown in FIG. 4A, are capable of energy conservation efficiently.

Figure 5A:
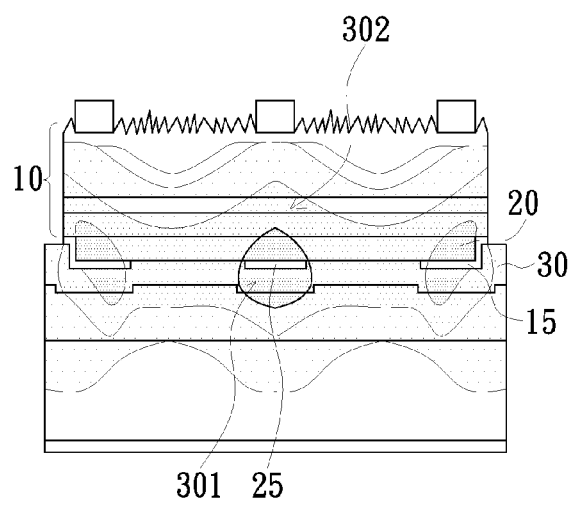
FIG. 5A is a cross-sectional view schematically illustrating the thermal flow in a semiconductor light-emitting device in accordance with one embodiment of the present invention.
Figure 5B:
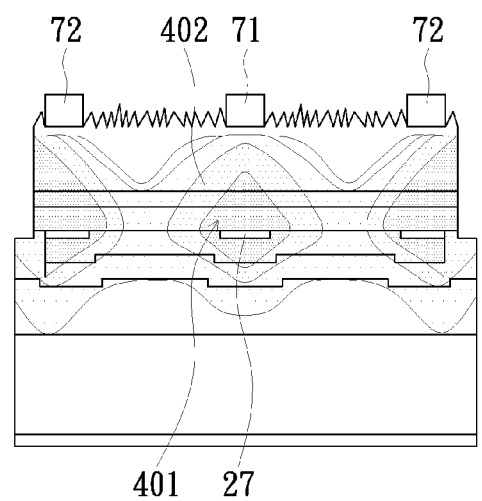
FIG. 5B is a cross-sectional view schematically illustrating the thermal flow in a semiconductor light-emitting device in accordance with one embodiment of the present invention.

Additionally, the light-emitting efficiency of the semiconductor light-emitting device would be influenced by the thermal dissipation efficiency. With reference to FIG. 5A and FIG. 5B, the configuration of FIG. 5A is identical to that of FIG. 4A; the configuration of FIG. 5B is identical to that of FIG. 4B. By comparison between FIG. 5A and FIG. 5B, the thermal dissipation efficiency may be influenced by the positions of the resistivity-enhancing structure and the protection ring. As shown in FIG. 5B, the thermal dissipation would be impeded by the current blocks 27 disposed between the epitaxial structure 10 and the light reflective metal layer 20 so that a hottest region 401 would mainly cover the epitaxial structure 10. However, since the resistivity-enhancing structure 25 and the protection ring 15 are disposed underneath the light reflective metal layer 20, the epitaxial structure 10 may contact with the whole surface of the light reflective metal layer 20 so that a hottest region 301 may be moved downwards and the heat generated from the epitaxial structure 10 may be dissipated more easily. Therefore, the thermal dissipation efficiency and the light-emitting efficiency of the device of FIG. 5A may be much better than that of FIG. 5B.

In the embodiment of the present invention, since most of the light is not generated from the regions of the epitaxial structure 10 beneath the first electrode structure 71 and the second electrode structure 72, thus while the light generated by the epitaxial structure 10 is reflected by the light reflective metal layer 20 in order to direct the light emitting outwards from the first surface 10a, most of the emitting light should not be shielded and absorbed by the first electrode structure 71 and the second electrode structure 72. Such that, the light-emitting efficiency of the semiconductor light-emitting device can be enhanced.

Figure 6:
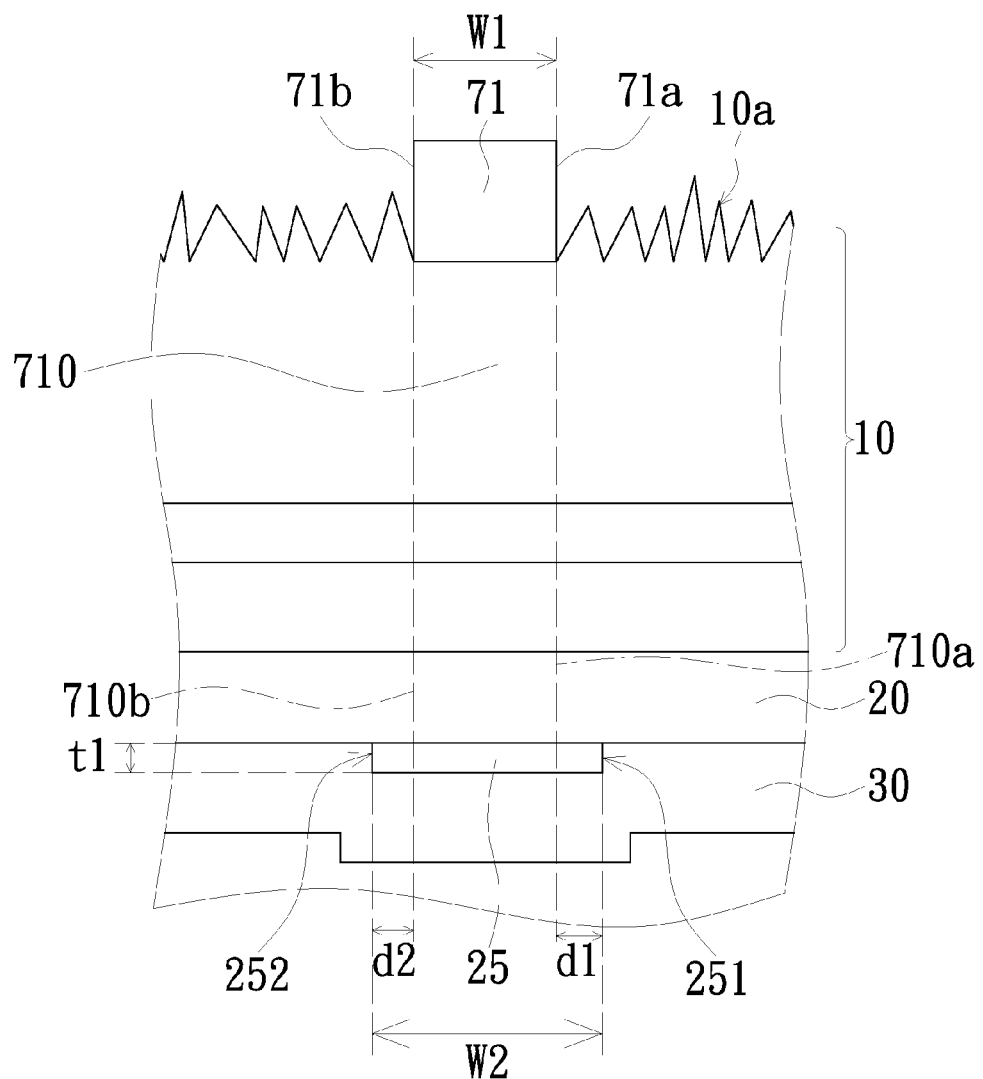
FIG. 6 is a cross-sectional view schematically illustrating the portion configuration of a semiconductor light-emitting device in accordance with one embodiment of the present invention.

Regarding to FIG. 6, a cross-sectional view of the portion configuration of a semiconductor light-emitting device in accordance with one embodiment of the present invention is schematically illustrated. It should be noted that the first electrode structure 71 is arranged corresponding to the position of the resistivity-enhancing structure 25. In other words, the resistivity-enhancing structure 25 is disposed beneath the first electrode structure 71.

For example, the first electrode structure 71 may have a central axial aligning with that of the corresponding resistivity-enhancing structure 25.

In some embodiments, as shown in FIG. 6, the resistivity-enhancing structure 25 has an end 251 exceeding a sidewall 71a of the first electrode structure 71 by x, where $0<x\leq 50$ micrometers; and/or the resistivity-enhancing structure 25 has an end 252 exceeding a sidewall 71b of the first electrode structure 71 by y, where $0<y\leq 50$. In some embodiments, the ends 251 and 252 of the resistivity-enhancing structure 25 may be respectively aligned with the sidewall 71a and 71b. More specifically, the first electrode structure 71 is completely disposed on a first electrode underlying region 710, wherein all sidewalls of the first electrode structure 71 are completely aligned all margins of the first electrode underlying region 710. Thus, a sidewall 71a of the first electrode structure 71 is aligned with a margin 710a of the underlying region 710; and a sidewall 71b of the first electrode structure 71 is aligned with a margin 710b of the underlying region 710. The resistivity-enhancing structure 25 has the end 251 which may be aligned with the margin 710a or extend outside the first electrode underlying region 710. It is noticeable that the shortest distance d1 between the margin 710a and the end 251 may range from 0 to 50 micrometers. Similarly, an end 252 of the resistivity-enhancing structure 25 may be aligned with the margin 710b or extend outside the first electrode underlying region 710. A shortest distance d2 between the edge 252 and the margin 710b may range from 0 to 50 micrometers.

Figure 7:
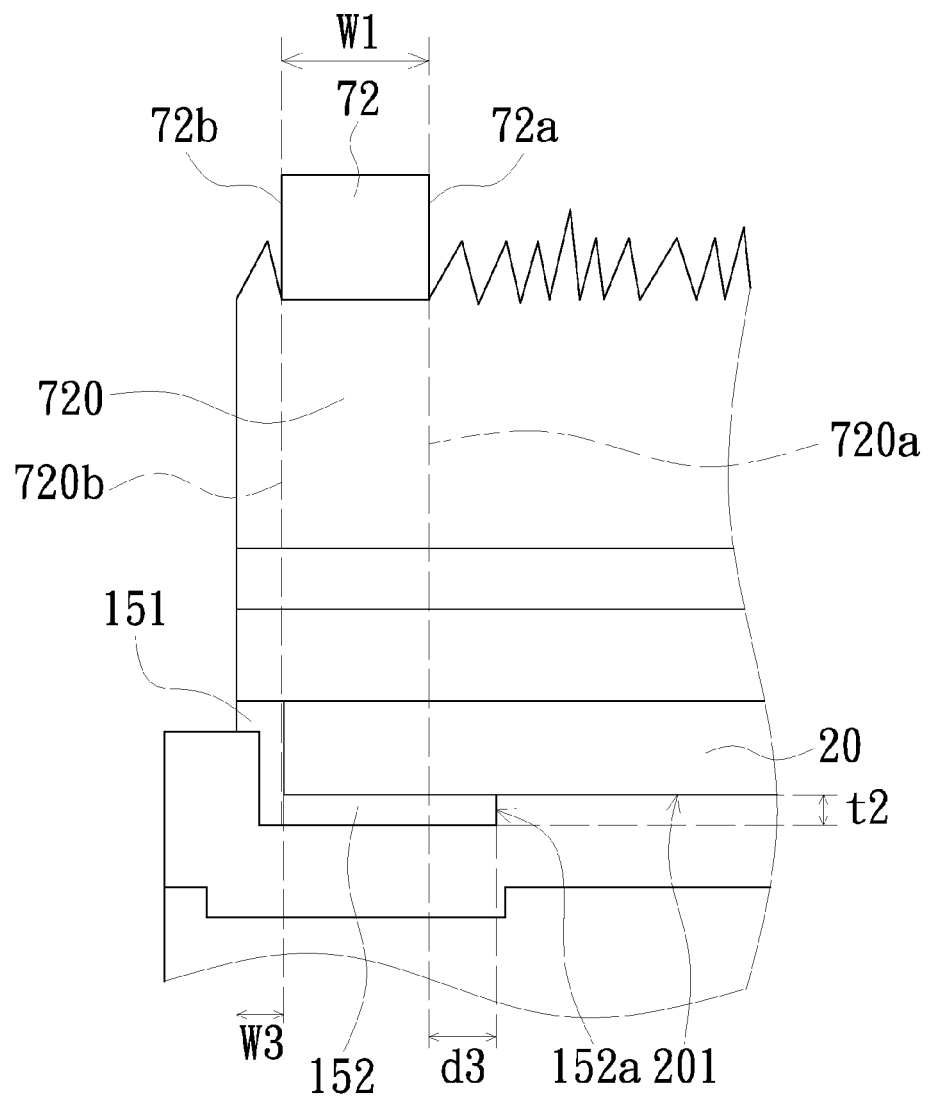
FIG. 7 is a cross-sectional view schematically illustrating the portion configuration of a semiconductor light-emitting device in accordance with one embodiment of the present invention.

Please see FIG. 7, a cross-sectional view of the portion configuration of a semiconductor light-emitting device in accordance with one embodiment of the present invention is schematically illustrated. The second portion 152 of the protection ring 15 may extend inwards along the surface 201 of the light reflective metal layer 20 so that an end 152a thereof may exceed a sidewall 72a of the second electrode structure 72 by z, where $0<z\leq 50$ micrometers. In some embodiments, the end 152a of the protection ring 15 may be aligned with the sidewall 72a. More specifically, the second electrode structure 72 is completely disposed on a second electrode underlying region 720, wherein all sidewalls of the second electrode structure 72 are completely aligned all margins of the second electrode underlying region 720. Thus, a sidewall 72a of the second electrode structure 72 is aligned with a margin 720a of the underlying region 720; and a sidewall 72b of the second electrode structure 72 is aligned with a margin 720b of the underlying region 720. The end 152a of the second portion 152 of the protection ring 15 may be aligned with the margin 720a or extends outside the second electrode underlying region 720. It is noticeable that the shortest distance d3 between the end 152a and the margin 720a may range from 0 to 50 micrometers.

It should be noted that the ranges of the shortest distance d1, d2 and d3 are critical. More specifically, the preferred ranges of d1, d2 and d3 can be observed by implementing an experiment on operation of the semiconductor light-emitting devices in accordance with one embodiment of the present invention. For example, in the first device, the d1, d2, and d3 are all equal to 0 micrometers; in the second device, the d1, d2, and d3 are all equal to 25 micrometers; in the third device, the d1, d2, and d3 are all equal to 50 micrometers; in the forth device, the d1, d2, and d3 are all greater than 50 micrometers. After operating the four devices respectively, it is observed that the illumination intensity of the second device may be more uniform than that of the first and the third devices; but that of the forth device may be the worst. Therefore, it is suggested that the shortest distance d1, d2 and d3 ranges from 0 to 50 micrometers.

In one embodiment, as shown in FIG. 6, the first electrode structure 71 has a width W1 ranging from 3 micrometers to 200 micrometers. Then, the resistivity-enhancing structure 25 may have a width W2 ranging from 3 to 300 micrometers. In addition, a thickness t1 of the resistivity-enhancing structure 25 may be in a range of 100 angstroms and 10000 angstroms. With reference to FIG. 7, the second electrode structure 72 also has the width W1 ranging from 3 micrometers to 200 micrometers. The first portion 151 of the protection ring 15 has a width W3 in a range of 5 micrometers and 100 micrometers; and the second portion 152 thereof has a thickness t2 ranging from 100 angstroms and 10000 angstroms.

Alternatively, the relative positions between the resistivity-enhancing structure 25, the light reflective metal layer 20, and the buffer layer 30 may be altered. For example, although the resistivity-enhancing structures 25 of the present embodiment is directly in contact with the light reflective metal layer 20, but in some other embodiments (not shown), the resistivity-enhancing structures 25 may be embedded in the light reflective metal layer, wherein the light reflective metal layer may have a plurality of grooves formed on the surface; those resistivity-enhancing structures are then disposed in those grooves and protruding from the surface of the light reflective metal layer; and the buffer layer is subsequently formed to cover the light reflective metal layer and the resistivity-enhancing structures. In a further embodiment (not shown), the resistivity-enhancing structures may be embedded within the buffer layer and formed by the following steps: A portion of the buffer layer is firstly formed on the light reflective metal layer; the resistivity-enhancing structures are then formed on the portion of the buffer layer; and the other portion of the buffer layer is subsequently formed on the resistivity-enhancing structures, so as to make the resistivity-enhancing structures embedded within the buffer layer.

In sum, It is found that to dispose the resistivity-enhancing structure(s) 25 and the protection ring 15 between the light reflective metal layer 20 and the buffer layer 30 corresponding to the position of the first electrode structure 71 and the second electrode structure 72 is capable of hindering the electric current (or electron flow) from flowing through the regions. Thus, a large amount of light can be generated in the portions of the epitaxial structure 10 beside the regions and would not be shielded and absorbed by the non-transparent first electrode structure 71 and second electrode structure 72. Besides, the light-reflected efficiency would be effectively enhanced by the cooperative warping of the protection ring and the buffer layer 30 both covering the light reflective metal layer 20. Therefore, the light-emitting efficiency of the semiconductor light-emitting device could be enhanced by the aforementioned ways. Furthermore, the embodiments of the present invention can reduce charge accumulation effect and current crowding effect and enhance thermal dissipation efficiently.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A semiconductor light-emitting device, comprising:
   a light-emitting epitaxial structure having a first surface and a second surface opposite to said first surface, wherein said light-emitting epitaxial structure has a first zone and a second zone enclosing said first zone;
   a first electrode structure disposed over said first zone and in electrically contact with said first surface;
   a second electrode structure disposed over said second zone and in electrically contact with said first surface;
   a light reflective metal layer disposed adjacent to said second surface;
   a resistivity-enhancing structure disposed adjacent to a surface of said light reflective metal layer and corresponding to a position of said first electrode structure, wherein said surface of said light reflective metal layer is away from said second surface;
   a protection ring having a first portion and a second portion, wherein said first portion surrounds and contacts with a sidewall of said light reflective metal layer, wherein said second portion is corresponding to a position of said second electrode structure and in contact with said surface of said light reflective metal layer;
   a buffer layer disposed adjacent to said light reflective metal layer and said resistivity-enhancing structure;
   a binding layer disposed adjacent to said buffer layer and away from said light reflective metal layer;
   a substrate disposed adjacent to said binding layer and away from said buffer layer; and
   a third electrode structure in electrically contact with said substrate.

2. The semiconductor light-emitting device according to claim 1, wherein the light-emitting epitaxial structure comprises:
   a first semiconductor layer with a first conductivity type, having a surface serving as the first surface;
   a second semiconductor layer with a second conductivity type, having a surface serving as the second surface; and
   a light-emitting layer disposed between the first semiconductor layer and the second semiconductor layer.

3. The semiconductor light-emitting device according to claim 1, wherein said resistivity-enhancing structure has a central axial aligned with that of said first electrode structure.

4. The semiconductor light-emitting device according to claim 1, wherein said protection ring and said resistivity-enhancing structure are disposed between said buffer layer and said surface of said light reflective metal layer.

5. The semiconductor light-emitting device according to claim 1, wherein a part of said first portion of said protection ring contacts with said second surface of said light-emitting epitaxial structure.

6. The semiconductor light-emitting device according to claim 1, wherein said first portion of said protection ring has a width ranging from 5 micrometers to 100 micrometers.

7. The semiconductor light-emitting device according to claim 1, wherein said resistivity-enhancing structure is beneath said first electrode structure and an end of said resistivity-enhancing structure is aligned with a sidewall of said first electrode structure or exceeds said sidewall of said first electrode by a distance less than 50 micrometers.

8. The semiconductor light-emitting device according to claim 1, wherein said second portion of said protection ring is beneath said second electrode structure and an end of said second portion of said protection ring is aligned with a sidewall of said second electrode structure or exceeds said sidewall of said second electrode structure by a distance less than 50 micrometers.

9. The semiconductor light-emitting device according to claim 8, wherein said end of said second portion of said protection ring extends inwards along said surface of said light reflective metal layer.

10. The semiconductor light-emitting device according to claim 1, wherein said second portion of said protection ring has a thickness ranging from 100 angstroms to 10000 angstroms.

11. A method for fabricating a semiconductor light-emitting device, comprising steps of:
providing a light-emitting epitaxial structure with a first surface and a second surface opposite to said first surface, wherein said light-emitting epitaxial structure has a first zone and a second zone enclosing said first zone;
forming a light reflective metal layer on said second surface;
forming a resistivity-enhancing structure over said light reflective metal layer and over said first zone;
forming a protection ring having a first portion and a second portion over said second zone, wherein said first portion surrounds and contacts with a sidewall of said light reflective metal layer, wherein said second portion is disposed on said light reflective metal layer, wherein said protection ring and said resistivity-enhancing structure are formed concurrently;
forming a first electrode structure in electrically contact with said first surface, wherein said first electrode structure corresponds to a position of said resistivity-enhancing structure; and
forming a second electrode structure in electrically contact with said first surface, wherein said second electrode structure corresponds to a position of said second portion of said protection ring.

12. The method for fabricating a semiconductor light-emitting device according to claim 11, wherein the step of providing the light-emitting epitaxial structure comprises:
forming a light-emitting layer over a first semiconductor layer having a first conductivity type and a surface serving as said first surface, wherein said light-emitting layer is disposed away from said first surface;
forming a second semiconductor layer having a second conductivity type over said light-emitting layer, wherein said second semiconductor layer has a surface serving as said second surface.

13. The method for fabricating a semiconductor light-emitting device according to claim 11, further comprising steps of:
forming a buffer layer over said resistivity-enhancing structure, said protection ring and a part of said light reflective metal layer conformally;
forming a binding layer over said buffer layer;
forming a substrate over said binding layer; and
forming a third electrode structure over and in electrically contact with said substrate.

* * * * *